United States Patent [19]
Vermeulen

[11] Patent Number: 4,799,242
[45] Date of Patent: Jan. 17, 1989

[54] MULTI-MODE DYNAMIC CODE ASSIGNMENT FOR DATA COMPRESSION

[75] Inventor: Johannes C. Vermeulen, Longmont, Colo.

[73] Assignee: International Business Machines Corporation, Armonk, N.Y.

[21] Appl. No.: 88,771

[22] Filed: Aug. 24, 1987

[51] Int. Cl.[4] .......................................... H04B 14/06
[52] U.S. Cl. ....................... 375/122; 360/40; 375/27; 381/31
[58] Field of Search ............... 375/27, 122; 370/118; 382/43, 56; 358/135, 138, 261; 360/39, 40; 369/59; 381/29, 31

[56] References Cited

U.S. PATENT DOCUMENTS

| | | | |
|---|---|---|---|
| 4,486,784 | 12/1984 | Abraham et al. | 358/261 |
| 4,494,151 | 1/1985 | Liao | 358/261 |
| 4,527,252 | 7/1985 | Donohue et al. | 364/900 |
| 4,591,829 | 5/1986 | Takeda | 340/347 DD |
| 4,608,652 | 8/1986 | Yokokawa et al. | 382/56 |
| 4,633,490 | 12/1986 | Goertzel et al. | 375/122 |
| 4,646,148 | 2/1987 | Lienard et al. | 358/135 |
| 4,648,119 | 3/1987 | Wingfield et al. | 382/56 |

Primary Examiner—Benedict V. Safourek
Attorney, Agent, or Firm—Carl M. Wright

[57] ABSTRACT

Bit-serial compression process improved by inclusion of character-repeat (character) mode. During the compression process in a bit serial (bit) mode, using a predictive scheme with code words for each predicted bit, the characters, typically bytes (eight bits), are assembled bit by bit. Each assembled character is compared to the preceding character. When two successive identical characters occur, the process changes to the repeat-character mode wherein successive identical characters are signaled in the same manner as correctly predicted bits. When a different character occurs, the process signals in a manner corresponding to an incorrectly predicted bit. Provisions are made for limitations imposed by finite code spaces, for supplying a data bit when recording a code word associated with an exhausted code space or different characted, and for indicating an identical character has occurred when recording a code word associated with an exhausted code space.

2 Claims, 8 Drawing Sheets

MULTI-MODE DYNAMIC CODE ASSIGNMENT FOR DATA COMPRESSION

DOCUMENTS INCORPORATED BY REFERENCE

U.S. Pat. No. 4,633,490 is hereby incorporated by reference.

BACKGROUND OF THE INVENTION

1. Field of the Invention

This invention relates to data compression, applicable to both data communications and data storage. Considerable efforts have been directed to the compression of data for transmission purposes because of the restrictions imposed on data communications by channel bandwidth limitations and a finite number of channels. Most efforts to increase storage capacities have been directed toward devising new ways of recording more data on the selected media, i.e., increasing the number of tracks and the data density. Relatively less attention has been given to the use of data compression to reduce the amount of space required to store data. The scheme for compressing data described herein is equally applicable to data transmission and to data storage.

The invention relates particularly to data compression schemes using bit serial schemes and increasing the compression ratio, i.e., the number of bits which can transmit a given message divided by the total number of bits in the given message, by incorporating a repeat-character mode where appropriate.

2. Description of Related Art

Information Theory provides a measure of the amount of information in a message. The minimum number of characters, m, required to send a message of n characters is the sum of the products of the number of occurrences of each character times the logarithm to the base k of the inverse probability of the occurrence of such character, where k is the number of different characters. For binary characters, k is equal to 2 and $$m = n(1)\log(1/P[1]) + n(0)\log(1/P[0]) \quad (1)$$

where
- m = the minimum number of bits required,
- n(1) = number of "1" bits in the message,
- n(0) = number of "0" bits in the message,
- P[1] = probability of occurrence of "1" bit, and
- P[0] = probability of occurrence of "0" bit.

The total number of bits in the message, i.e., the bit stream to be transmitted or stored, is $$n(t) = n(1) + n(0)$$

so that $$P[1] = n(1)/n(t) \text{ and } P[0] = n(0)/n(t).$$

Logarithms in equation (1) are taken to the base 2. (The logarithm of the inverse of a probability is usually taken since probabilities are fractions which have negative logarithms. The negative logarithm of a number is the logarithm of its inverse.)

The informational content (entropy) can always be calculated knowing the entire message. Compression using Huffman codes is based on a priori knowledge of the information parameters. For example, the telegraphic Morse code is closely correlated to a Huffman code of the English language. That is, the shorter codes are assigned to the more frequently occurring letters of the alphabet. A Huffman code using binary digits (bits) can also be assigned to the letters of the English language. For example,

| | |
|---|---|
| 11 | = E |
| 10 | = T |
| 01 | = O |
| 001 | = A |
| 0001 | = N |
| 000010 | = I |
| 000011 | = R |
| ...... | |

A basic requirement of a Huffman-type code is that each encoding of a character be distinct so that it can be uniquely decoded without delimiters between characters.

There are, of course, many possible encoding schemes but they depend on a priori knowledge of the information such as, in the above example, the letter frequency of the English language. Such encoding schemes, also referred to as data compression systems, use the entire original message to extract the informational parameters for assigning an efficient code. For long messages, the procedure of using the total message to derive the encoding parameters is undesirable for many apparent reasons.

U.S. Pat. No. 4,633,490 describes a compression/decompression with symmetrical adaptive models used in the transmitting and receiving systems. The models predict the nth bit based on statistics derived from the preceding $(n-1)$ bits.

The encoders described below are directed to encoding messages using the parameters derived from the bits that have been processed, i.e., the coding is based on the history created by the information already processed.

SUMMARY OF THE INVENTION

The bit serial systems of the prior art continue to operate bit serially even when recognizable patterns of ones and zeros are repeated on a character basis. The present invention recognizes when certain patterns occur, in the form of characters, and changes to a repeat-character mode to take advantage of successive identical characters.

For k-bit characters, the compression ratio depends on k. The value of k in the preferred embodiment is taken as eight because most present binary devices are constructed to handle eight-bit characters, more commonly called bytes, or multiples thereof. Extension to 16-bit or characters of other bit lengths will be obvious to those of ordinary skill in the art in light of the detailed descriptions of the preferred embodiment.

In accordance with the invention, the previous bits of an input data stream are used to predict a next bit and to calculate the probability of the predicted bit being equal to the corresponding next bit from the input data stream. A binary code word is generated having a length proportional to the calculated probability. If the predicted bit and actual bit are the same, the generated code word is not used; otherwise, the code word is issued to a utilization device. Successive characters in the input data stream are compared and, if they are identical successive characters, different code words are generated for successive characters. When a nonidentical character occurs, the last such generated code word is issued to the utilization devices.

BRIEF DESCRIPTION OF THE DRAWING

The invention is described in detail by referring to the various figures which illustrate specific embodiments of the invention, and wherein like numerals refer to like elements.

DESCRIPTION OF THE PREFERRED EMBODIMENT

In the following description, the bit serial mode is referred to simply as the bit mode, and the repeat-character mode, as the character mode.

Figure 1:
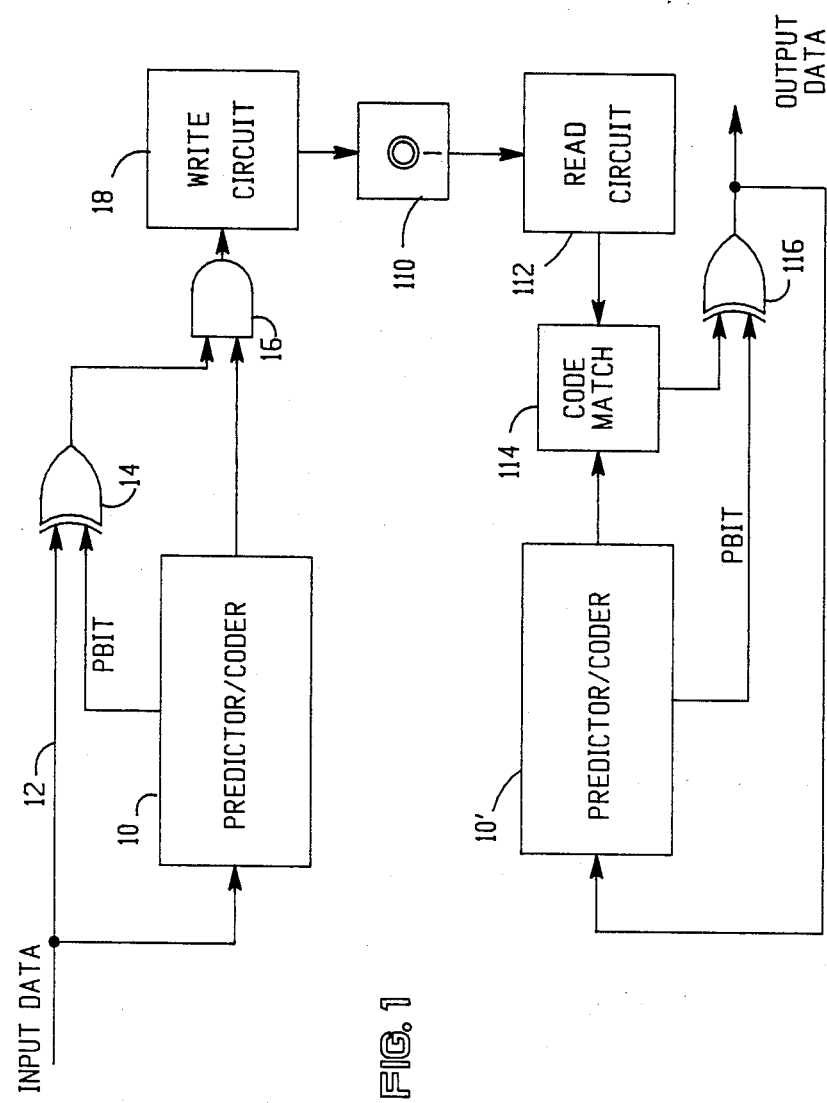
FIG. 1 is a block diagram of a bit serial data compression/decompression system in which the invention can be efficiently incorporated.

The block diagram of FIG. 1 illustrates a system in which the invention is particularly useful. A predictor/coder 10 is a device that predicts the next bit of the input data stream and supplies the predicted bit on a PBIT line. The input data on a line 12 supplies the input bits to the predictor/coder 10 to supply the data used to predict the next bit.

The predictor/coder 10 also generates a different code word for each prediction. The code word is coupled to a write circuit 18 through a gating circuit 16. If the predicted bit, PBIT, is the same as the actual bit on the input data line 12, then an Exclusive-OR (XOR) gate 14 is disabled inhibiting the gating circuit 16. If the predicted bit, PBIT, is different from the actual bit on the input data line 12, then the XOR gate 14 is enabled, in turn enabling the gating circuit 16 which gates (issues) the code word to the write circuit 18. The write circuit 18 is shown as recording the issued code words on a diskette 110.

If the predictor/coder 10 predicts the next bit correctly, then nothing is issued to the diskette 110. If the predicted bit is wrong, then a code word is issued to the diskette 110. Code words are also issued whenever no further code words are available, and the code space is reset. This is a special code word with the correct data bit appended in lieu of processing the data bit in a subsequent cycle using a new code space.

For decompression, the diskette 110, is read by a read circuit 112, and the code words are stored. A predictor/coder 10' operates the same as the predictor/coder 10. The predicted bits are supplied to an XOR gate 116 and the code words associated therewith are coupled to a code match circuit 114. The n-bit code words from the predictor/coder 10' are compared with the first (or next) n-bits read from the diskette 110 by the read circuit 112.

Since the bits predicted and the code words supplied from the predictor/coder 10' are the same as those from the predictor/coder 10 for the same input stream, then when a bit is incorrectly predicted, the code match circuit 114 will match the n-bit code word from the predictor/coder 10' with the first n bits read from the diskette 110. In response, the code match circuit 114 will supply a signal to activate the XOR gate 116 which inverts the predicted bit, PBIT, so that the output data bit from the XOR gate 116 will be correct. The output data from the XOR gate 116 is the same as the input data on the line 12 and is coupled to the input of the predictor/coder 10' so that it will predict the next bit based on the same information as that which was supplied to the predictor/coder 10.

If the predictor/coder 10' exhausts its supply of code words, it generates a code word indicating such condition which should be matched with the next code word from the diskette 110. (Since the predictor/coders 10 and 10' operate identically for the same input stream, the code space is exhausted after the same sequence of code words and the code words issued to indicate that the code space is exhausted must therefore be the same.) The next, i.e., (n+1)-th, bit from the diskette 110 is the output bit which is passed to the output data stream by forcing the PBIT line to a false (or zero) value to pass the extracted n+1 bit from the code match device.

When a code word is recognized, the first n bits —n+1 bits if the code word indicated the code space was exhausted—are erased and the succeeding bits are moved up for the next comparison procedure.

As long as the code words generated by the predictor/coder 10' do not match the bits from the diskette 110, the PBITs predicted are the actual bits. When a PBIT is incorrect, it is corrected by inversion through the XOR gate 116.

The predictor systems can be constructed using counters as described below or more elegant models can be used to increase the probability of correctly predicting the next bit. The coder sections of the predictor/coders 10 and 10' also can be one of several designs so long as both are of the same type and operate the same.

The compression ratio depends on the predictor/coders 10 and 10'—the "smarter" or more adaptable they are, the more compression which results.

The compression ratio also depends on the code words. Code words must supply or imply some information about the number of preceding correct bits that were predicted before an incorrect prediction was made. Huffman codes, i.e., variable length codes assigned so that the most commonly occurring characters use the fewest bits, make an encoding scheme more efficient.

A simple predictor 10 (and 10' ) for the illustrative embodiment can be two counters, one for counting the number of ones and the other for counting zeros, with a comparator for supplying a predicted bit based on which counter contains the greater count value. That is, if there is a higher count of ones, then a one is predicted. The size of the counters need not be large if the system is designed to divide both register contents by two (requiring only a right shift of the register contents by one bit position) whenever the most significant bit of either counter is set.

A simple coder 10 (and 10') can be a counter that counts the number of correct predictions. When a bit is incorrectly predicted, the coder counter contents are gated out as the code word. When all the bits of the encoder counter are set, the contents can be gated out to indicate that the counter is being reset, i.e., that the code space is exhausted.

The reset code word is always sent when it occurs but it is necessary to provide some additional information to indicate whether the predicted bit associated with the reset code word is correct or not. The simplest way of supplying such information is to append the correct bit to the end of the reset word. This is more efficient than waiting for the next cycle to process the bit.

Alternatively, the counter values can be used as an address to a Read-Only Memory (ROM) to select an encoded word representing the number of correct bits predicted before the incorrect prediction.

Better compression can be realized by a more sophisticated source model or by more efficient code word generation by the coder circuit, or both.

A stochastic system can provide efficient compression by producing code words based on probabilities where small code words are produced when the probability of a wrong prediction is high and longer code words when the probability of a correct prediction is high. This will make more efficient use of the code space. If the longer code words are generated for low probabilities, then fewer long code words will be sent. If the shorter code words are generated for high probabilities of wrong predictions, then more short code words than long ones will be sent. The net result is better compression.

The probabilities of one or the other bit occurring are calculated using logarithms (to the base two, preferably) of the ones or zeros counter values. It is not necessary that the exact logarithm or probability be calculated; a relative value is sufficient for purposes of the invention. Therefore, using logarithms to the base two to two decimal places satisfies the requirements of the system according to the invention to operate at an optimum functional level.

The base two is chosen because the variables are expressed as binary values. In the illustrative embodiment, the logarithms are expressed as eight bit binary numbers having two fractional bits. For example, 00100011 represents 001000.11, i.e., 8.75 expressed as an equivalent decimal value.

The probabilities, the ratio of a counter's value to the total value of both counters, is expressed by an eight bit fraction. The logarithm of a fraction is a negative value so the logarithm of the inverse of the probability is a positive value. There is no difference, however, in viewing the logarithm of a probability as an implied negative number, as an absolute value, or as an logarithm of an inverse probability. The values are represented by positive numbers and are inversely proportional to the probability value. That is, the smaller the probability, the larger will be the logarithm of that probability.

In the following description, Pb represents the binary value of the probability of P; Pd, the decimal value; log[2]P, the probability of P as a decimal value; and Padj, the binary adjusted probability value. The following steps illustrate a manner by which the probabilities can be calculated.

For P=0, let log[2]P and Padj=0 as a convention.

For Pb=00000001 (actually 0.00000001), Pd=0.0039063. The value of log[2]P is −8 but as noted above, log[2](1/P)=8. By rounding off to the nearest 0.25 (two binary decimal places), Padj=100000 (actually 1000.00) which has a decimal value of 32.

Similarly, the logarithm value for Pb=00000010 (Pd=0.0078125), log[2](1/P)=7.00, and Padj=11100 (actually 111.00) which is decimal 28.

A simple implementation for determining the logarithm values is to use a table look-up technique. In hardware, this can be accomplished using a ROM where the address is Pb and the output data is Padj. Alternatively, programmable logic arrays can be constructed to supply the value of Padj for an input value of Pb. In a software embodiment, a table of successive Padj values is stored beginning at a some given address and the Padj values are retrieved using the Pb value as a displacement or offset from the given address of the first entry. The first sixteen entries in such a table are shown below with the least three significant bits of Pb heading the columns, the other five bits of Pb heading the rows, and the table entries are the decimal values of Padj.

|        | 000 | 001 | 010 | 011 | 100 | 101 | 110 | 111 |
|--------|-----|-----|-----|-----|-----|-----|-----|-----|
| 00000: | 0   | 32  | 28  | 26  | 24  | 23  | 22  | 21  |
| 00001: | 20  | 19  | 19  | 18  | 18  | 17  | 17  | 16  |

Although the values are not exact for the values of the logarithms to the base two, the actual values resulting from the above detailed construction of the look-up table are sufficient for the purposes of the invention. Other approaches may be more accurate or similarly satisfactory. These are considered to be within the ordinary skill of the art to implement. The desirable criteria in choosing among the alternatives are speed of execution and simplicity of implementation.

Figure 2:
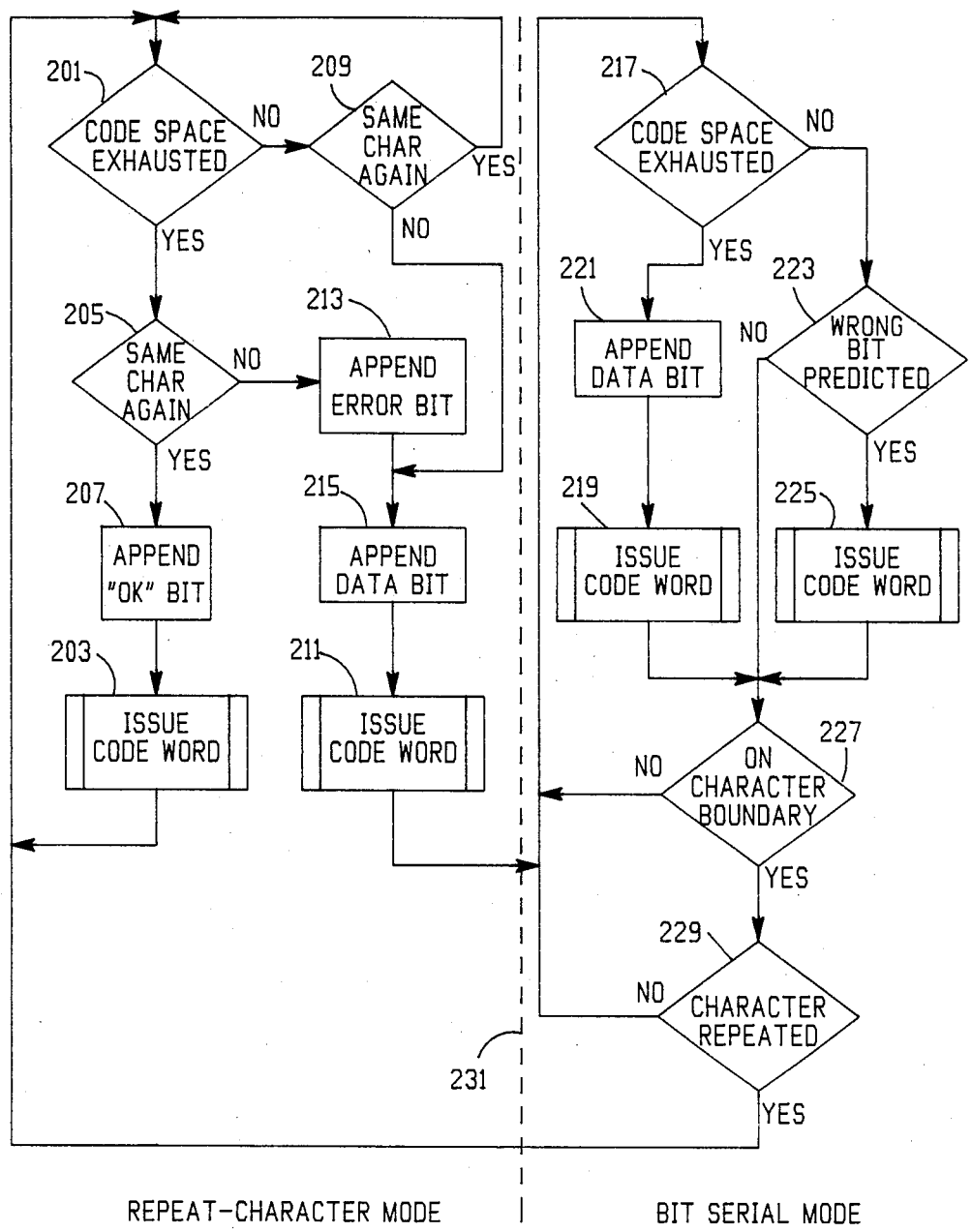
FIG. 2 is a flowchart illustrating the addition of a repeat-character mode to a bit serial mode compression process.

The invention is directed to improving data compression in bit mode systems by changing to a character mode when appropriate as described in more detail below. FIG. 2 illustrates the repeat character mode of the invention. Initialization and counting the characters processed to determine termination of the process are omitted as being within the skill of the art.

In FIG. 2, the steps to the right of the dotted line 231 are those described above for a bit serial compression mode. Beginning with a bit test (223), if the correct bit is predicted, another test (227) determines whether the process is on a character boundary, i.e., whether the next bit is the first bit of a new character. If not on a character boundary, then a test (217) determines whether the code space is exhausted.

If the wrong bit is predicted (223), a code word is issued (225) before the character boundary test (227) is made.

If the code space is not exhausted (217), the above described sequence is repeated. If the code space is exhausted, then the actual data bit being processed is appended to the reset code word (221) which is issued (221) Then the character boundary test (227) is repeated. (Whenever a code word is issued, the code space is reset.)

When a character boundary has been reached (227), a test (229) determines whether the last character is the same as the previous character. If not, the bit mode continues as described above.

When a character is repeated, the system according to the invention shifts to a character mode. The first step in the character mode checks the code space (201). If the code space is not exhausted, a test (209) determines whether the same character is repeated. If so, the code space exhausted test (201) is repeated. If not, the actual data bit is appended (215) and the appropriate code word is issued (211). The sequence then returns to the bit mode.

When the code space is exhausted in the character mode (201) and if the previous character is repeated (205), then a bit is appended (207) and the code word is issued (203). The character mode continues at the code space test (201). If the code space is exhausted and the previous character is not repeated (205), then an error bit must be appended (213) to indicate the character was not repeated and the actual data bit must also be appended (215) before the code word is issued (211).

By changing to such character mode, long runs of identical characters are more efficiently compressed. When the data stream represents picture elements (pels), long sequences of similar characters are likely to occur when the picture being encoded has large areas of the same color or gray scale. In text, long sequences of spaces, dots, or dashes may occur which can be more efficiently encoded using the character mode.

Figure 4A:
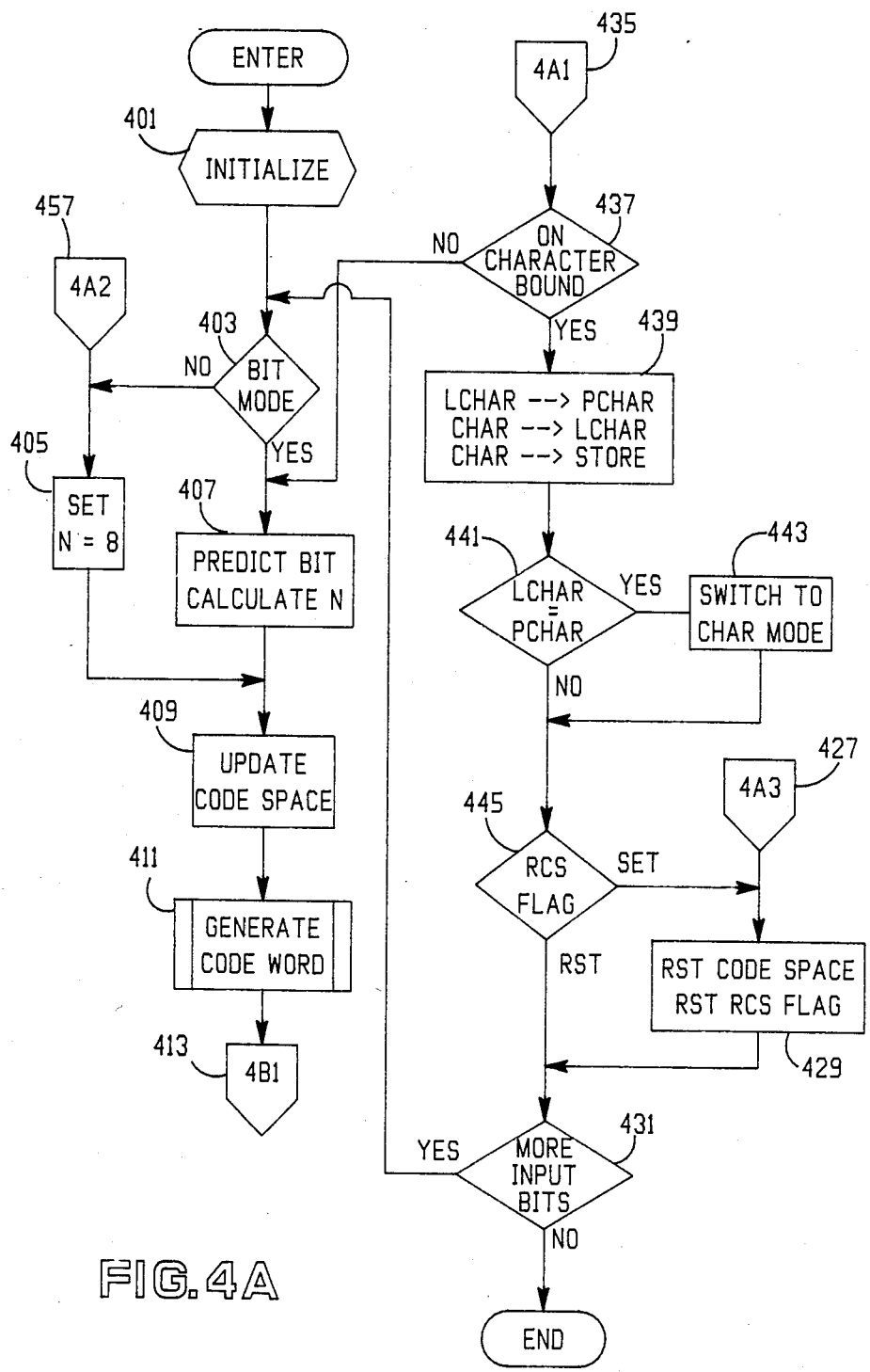
FIGS. 4A and 4B are a flowchart illustrating a decompression process for converting the issued code words from the compression process of FIGS. 3A and 3B into the original input data stream to such compression process.
Figure 4B:
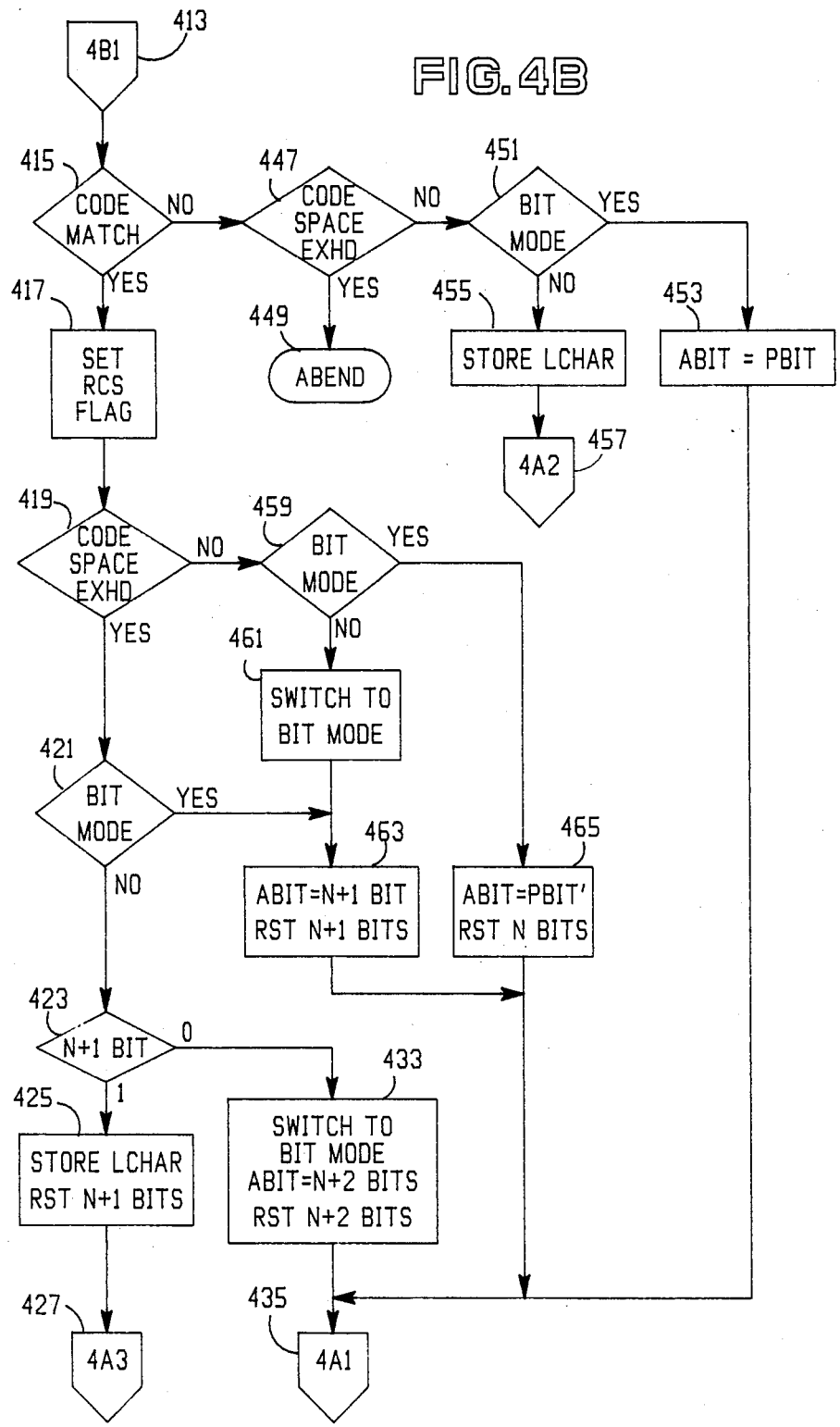
Figure 5:
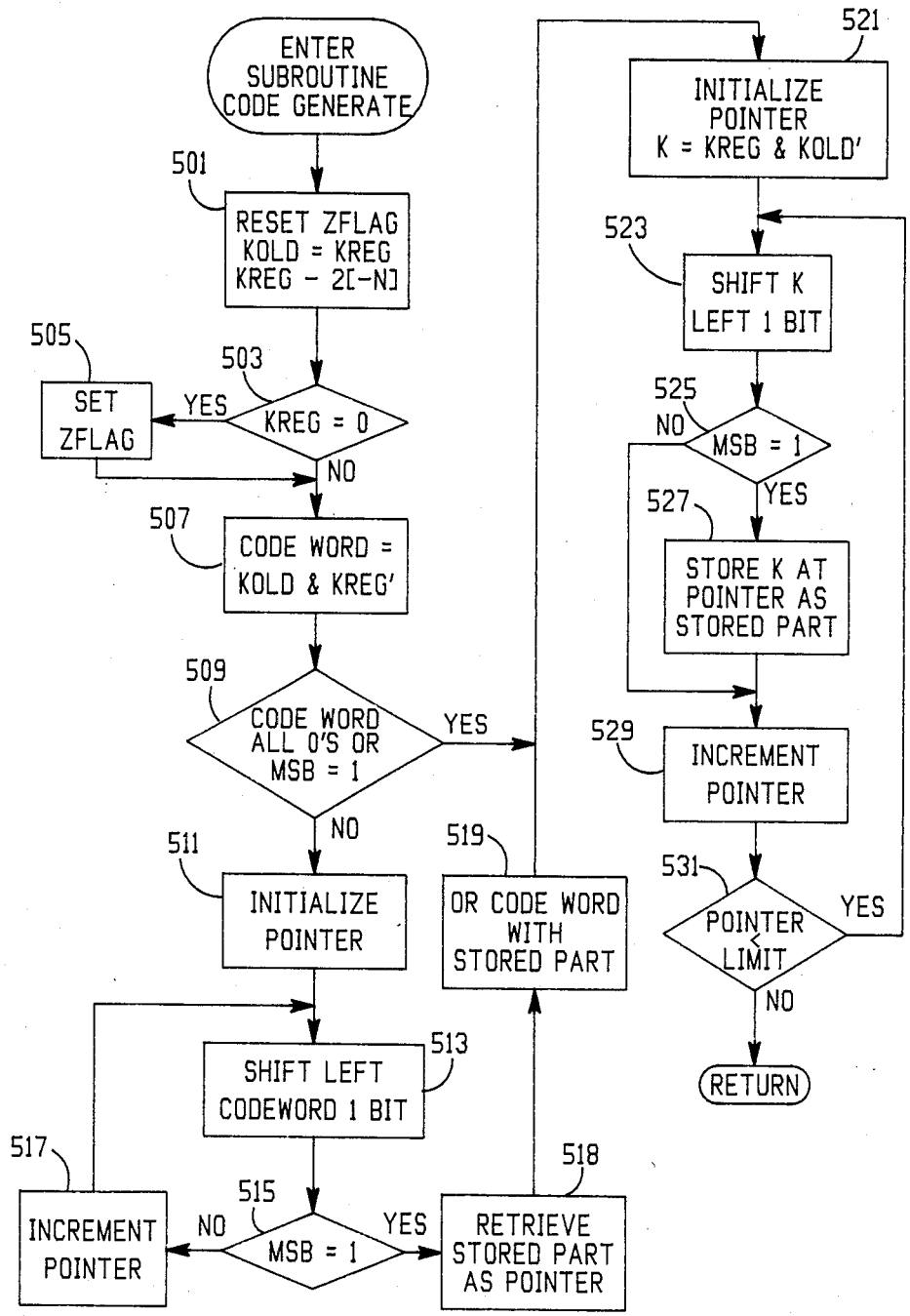
FIG. 5 is a flowchart illustrating a subroutine for generating code words.

A preferred embodiment of the invention is shown in FIGS. 3 through 8 in the form of flowcharts from which a general purpose digital computer program can be written by a person of ordinary skill to practice the invention. A suitable subroutine for efficiently generating code words and for managing the code space is shown in the flowchart of FIG. 5 and is described in detail below. The characters are considered to be bytes, i.e., eight bits.

In the following description of the preferred embodiment, the following abbreviations are used.

| | |
|---|---|
| ABIT | actual bit |
| ADSTAT | address of STAT0 and STAT1 counters |
| BYTES | uncompressed byte count (length of message) |
| CBCNT | number of bits per character (eight herein) |
| CTBYTES | count of bytes processed |
| KOLD | previous K-register value |
| KREG | K-register value |
| LCHAR | last character |
| LCM | leaving repeat character mode (a flag) |
| MSB | most significant bit |
| PBIT | predicted bit |
| PCHAR | previous character |
| RBFLAG | bit/character mode indicator (0 = bit mode; 1 = character mode; 2 = about to leave character mode - replaces LCM) |
| STAT0 | one of 256 8-bit zero-bit counters |
| STAT1 | one of 256 8-bit one-bit counters |
| ZFLAG | flag to force code word (indicate code space exhausted) |

Figure 3A:
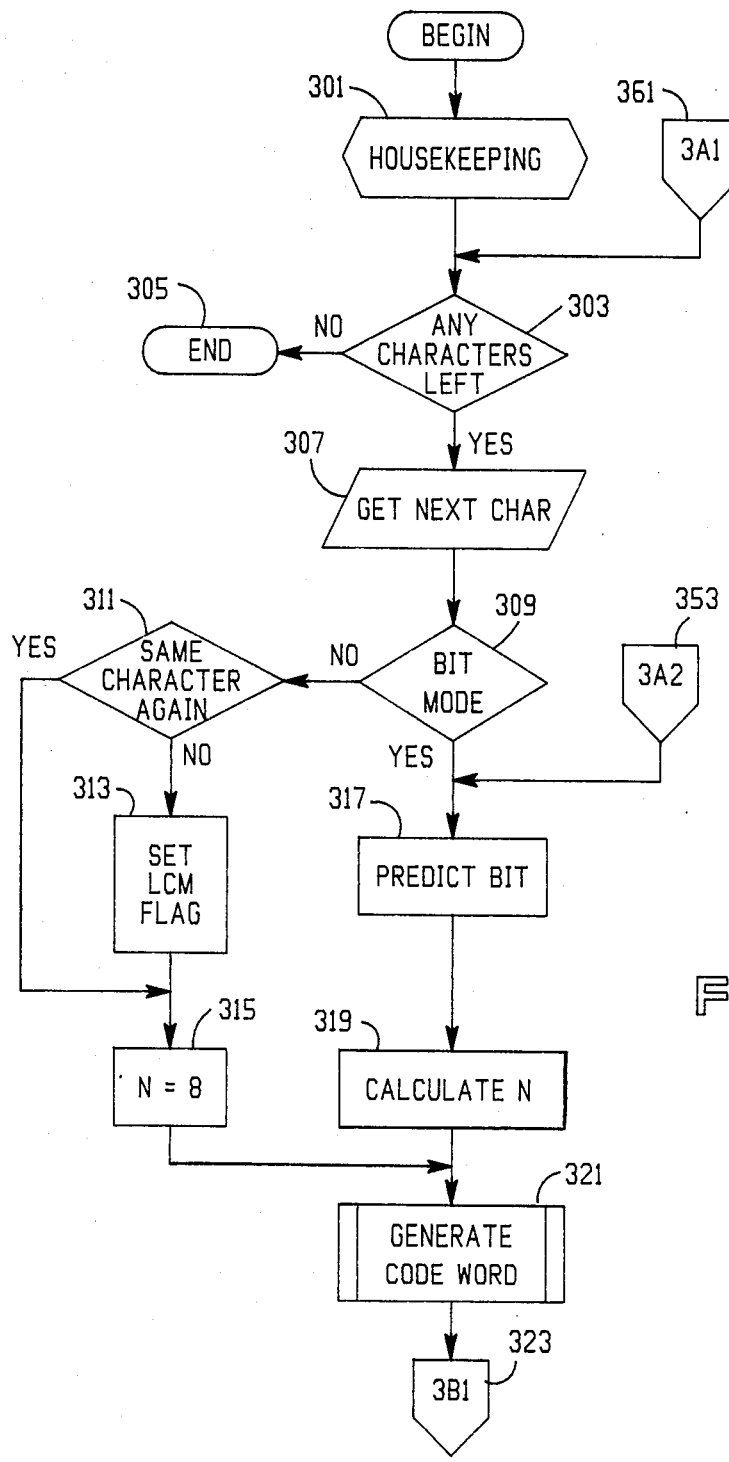
FIGS. 3A and 3B are a flowchart illustrating a bit-serial compression process incorporating a repeat-character mode according to the invention.
Figure 3B:
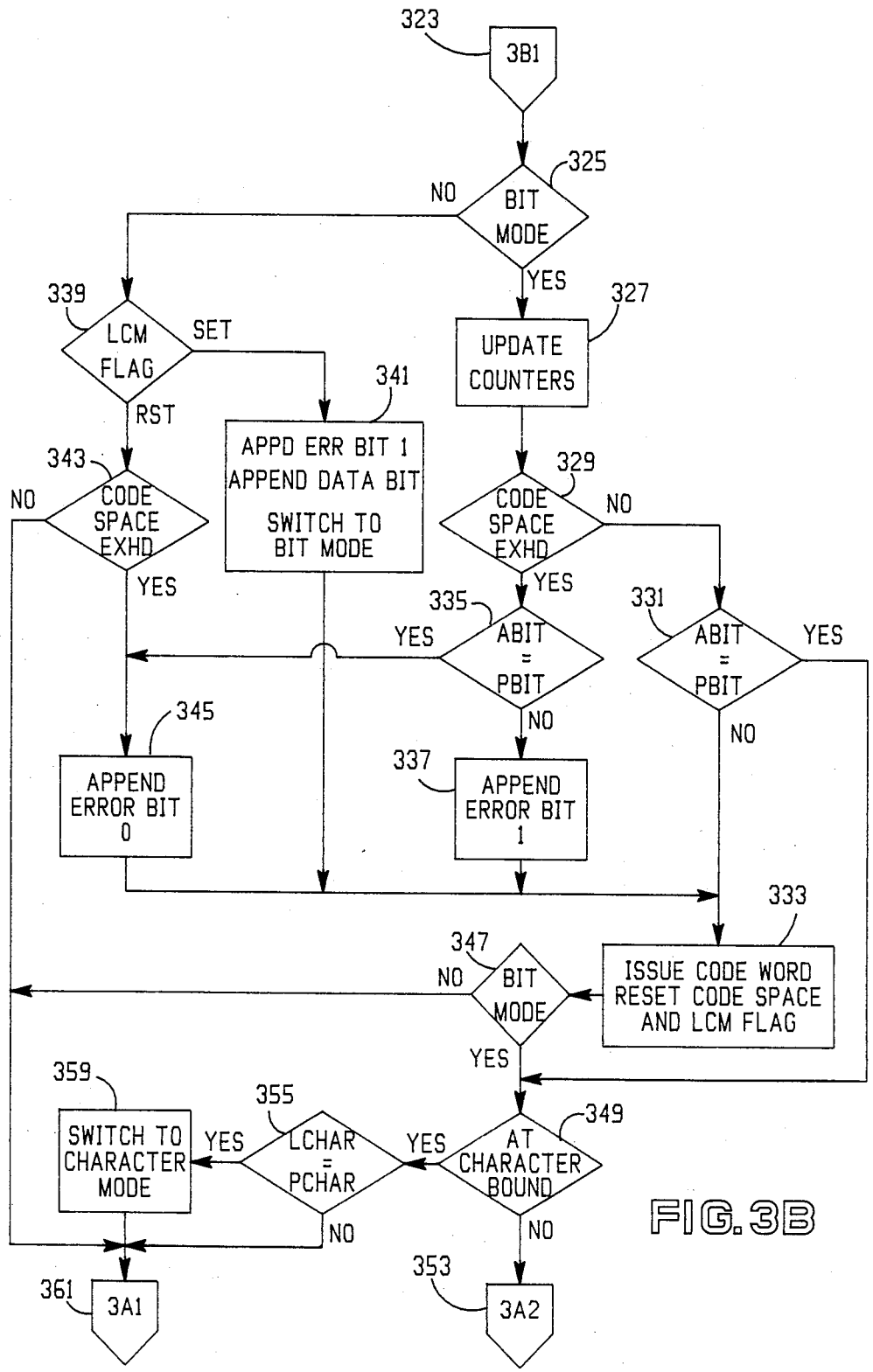

The compression routine is shown in the flowchart of FIG. 3A and FIG. 3B. In FIG. 3A, the first step (301) is a housekeeping task which initializes the various constants and flags, including keeping account of the number of bytes in the message to be compressed. For example, STAT0 and STAT1 are set to an initial value of one. CBCNT is set to eight (for bytes as characters) and KREG is set to a hexadecimal value of 0100. Other flags and counters are reset.

Next, a test is made (303) to determine whether any characters remaining to be processed and, if not, the program ends (305). As long as characters are to be processed, the program execution proceeds by fetching the next character (307). Then a test is made to determine whether the system is in the bit mode (309). If in the bit mode, which it must be for at least the first two characters, the next bit is predicted (317).

Next, the value of N is calculated (319) and a subroutine is called to generate the code word (321). (N is the number of bits in the current code word and, in the illustration example, is limited to a maximum of eight bits.) The off-page connector (323) indicates continuing to FIG. 3B and is considered the same connector in both figures. A test is again made to determine whether the system is in the bit mode (325) and, if so, the ones and zero counters, STAT1 and STAT0 are updated (327). This is followed by a test to determine whether the code space is exhausted (329). If not, then the actual bit is tested against the predicted bit (331). If they are equal, then a test is made to determine whether all the bits of the present character have been processed, i.e., at a character boundary (349).

If not at a character boundary, then as shown by the 3A2 connector (353), a return is made to FIG. 3A at the off-page connector 3A2 (353). This indicates that the program predicts the next bit (317) and the sequence previously described is repeated.

In FIG. 3B, if the actual bit (ABIT) was not equal to the predicted bit (PBIT) (331), then the code word is issued and the code space and LCM flag are reset (333). Following the issuing and resetting of the code space, a test is made to determine whether the system is in the bit mode (347), and, if so, the test is repeated to determine whether the system is at a character boundary (349). If not, the path indicated by the off page connector 3A2 (352) is repeated.

If at a character boundary (349), a test is made to determine whether the last character, LCHAR, is equal to the previous character, PCHAR, (355). If not, as would be the case for at least the first two characters, then the system execution path returns via the off-page connector 3A1 (361) to determine whether any characters are left (303).

If the code space is exhausted (329), then a test whether the ABIT equals the PBIT is made (335). If so, then zero error bit is appended to the code word (345) and the code word is issued and the code space reset (333). A zero error bit indicates the correct bit was predicted and that the code word is being issued because the code space is exhausted. A one error bit indicates the predicted bit was incorrect. Alternatively (as shown in the decompress process), the appended bit can be the actual bit.

If ABIT is not equal to PBIT (335), then a one error bit is appended to the code word (337) before it is issued (333) Thus, the code word that indicates that the code space is exhausted also indicates whether the correct bit was predicted by means of the error bit appended to the code word. As will be seen in the decompression routine, the n+1 bit will be sensed whenever the code word corresponds to the code space being exhausted. The appended bit may also be the actual data bit occurring during the cycle when the code space was exhausted as described above to save a cycle, i.e., using the next cycle to process the bit.

The above sequence of events continue unless two consecutive characters are identical. Then LCHAR equal to the PCHAR (355) will cause the system to switch to the character mode (359) and continue as indicated by the off-page connector 3A1 (361).

It is important that the last character, LCHAR and the previous character, PCHAR, be compared after the bits have been processed in the bit mode because the decompression routine has no a priori knowledge of the input data and only can detect that a character has been repeated after it is received.

When in the character mode, the test for the bit mode (309) leads to another test to determine whether the same character has been repeated (311). If not, then the Leaving Character Mode (LCM) flag is set (313). If the character is repeated (311), the LCM flag is not set.

Next, the value of N is set to eight (315) so that the code words in the character mode always have a length of eight. This is merely a convenience which allows for a greater number of code words and is more economical to implement. A variable length code word for better compression could be used in accordance with the teachings of this invention.

After the code word is generated (321), the bit mode test (325) leads to a test of the LCM flag (329). If the LCM flag is set or, alternatively, the RB flag is equal to a value of two, then the test is made to determine whether the code space is exhausted (343). If not, the program execution continues via the off-page connector 3A1 (361) to continue processing characters while the LCM flag is reset (339). When the code space is exhausted (343), then a zero error bit is appended to the code word (345) as previously described and the code word is issued (333).

When a different character is fetched, the same character test (311) causes the LCM flag to be set (313). After setting the value of N to eight (315), generating another code word (321), and testing for bit mode (325), the test of the LCM flag (339) causes a one error bit to be appended to the code word, appends the data bit to the code word, and switches to the bit mode (341). The code word is then issued and the code space reset (333). At the next bit mode test (347), the next step will be the test for character boundary (349). Since it will not be at a character boundary in the sequence described and the first bit of the different character has been set appended to the code word, the program continues via the off-page connector 3A2 (353) to predict the next bit and the sequence previously described for the bit mode is repeated.

If the bit mode is indicated by the RB flag equal to zero, then the LCM flag need not be reset. If separate flags are used for bit mode and LCM, the LCM flag is reset when switching to the bit mode.

In the compression routine just described, the characters are treated a bit at a time until at least two characters have been processed. Thereafter, if the character are identical, the system switches to the character mode which cycles in a shorter path, processing an entire character at a time, thereby increasing the compression ratio of the system as well as the processing speed.

The above sequence continues until all the input characters have been processed. This is signalled by keeping track of the number of characters processed and comparing the number processed to the number in the message.

The code space is reset by resetting a counter which keeps track of the code words generated but not issued.

A data decompression system is similar to the compression system described with reference to FIGS. 3A and 3B and converts the issued code words into the original input data stream. This will now be explained with reference to the flowchart of FIGS. 4A and 4B.

FIGS. 4A and 4B are a flowchart of a decompression process according to the invention. Initialization (401) is similar to the housekeeping task in the compression process. The information available is used to set the counters and registers as previously described for the compression algorithm except that information such as the number of bytes to be compressed is not known ab initis by the decompression process. The operation of the decompression process is analogous to the compression algorithm described in connection with FIGS. 3A and 3B.

Initially, the system is in the bit mode so the bit mode test (403) is followed by predicting the bit and calculating the value of N (407).

The code space is updated (409) and a code word is generated (411) using the same subroutine as the compression process. If, at the bit mode test (403), the system is in the character mode, then N is set to eight (405) as was the case in the compression process. The 4B1 off-page connector (413) leads to a code match test (415) in FIG. 4B.

The code match test compares the first N bits of the input data to the N bits of the generated code word. If there is no code match, then the code space is checked to determine whether it is exhausted (447). If the code space has been exhausted and there is no code match, then an error has occurred which causes an abnormal end (449). If the code space is not exhausted (447), then a test is made whether the system is in the bit mode (451).

If in the bit mode, then the actual bit ABIT, is the predicted bit, PBIT (453). The program path continues in FIG. 4A via the 4A1 off-page connector (435).

There, a check is made to determine whether the system is on a character boundary (437). If not, then the process just described repeats, i.e., predicting the next bit, calculating the value of N (407), and so forth.

In FIG. 4B, if the system was not in the bit mode (451), then the character previously received, LCHAR, is stored in the memory (455). That is, there was no code match and the system is in the character mode so the same character must have repeated. The program then continues to FIG. 4A via the 4A2 off-page connector (457) which continues execution by setting N to eight (405) and continuing as previously described.

In FIG. 4B, a code match (415) causes the reset code space (RCS) flag to be set (417) followed by a test whether the code space is exhausted (419). If so, then a test is made of the bit mode (421). If not in the bit mode, i.e., the system is in the character mode, then the value of the n+1 bit is examined (423). If it is one, then the code word indicated that the code space was exhausted and that the character was the same as the previous character. Therefore, the previous character, LCHAR, is stored and n+1 leading bits of the input data are removed. The program continues in FIG. 4A as directed by 4A3 the off-page connector (427).

Since the path just described set the RCS flag, it is known therefore to reset the code space and reset the RCS flag (429). Next, a test is made whether there are more input bits (431). If not, then the program has ended and the data stored as characters are the same as the input data stream which generated the code words making up the input bits to the decompression algorithm. If there are more input bits, then the program resumes at the bit mode test (403).

After a code match in FIG. 4B (415), if the N+1 bit is a zero (423), then the code word indicating the code space was exhausted has appended a zero bit indicating that the next character was not the same as the previous character. Therefore, the process switches to bit mode (443) and the actual bit is the next appended bit, i.e., the N+2 bit, and the system removes the leading N+2 bits.

If there was a code match (415) and the system was in the bit mode (421), then the actual bit is the appended bit, i.e., N+1 bit, which is saved and N+1 bits are reset (463). In other words, the code match indicated that the code word was issued for an error in the prediction at the same time the code space was exhausted so the correct bit was appended to the N bits of the issued code word.

If there is a code match (415) and the code space is not exhausted (419), then a bit mode test is made (459). If not in the bit mode, then the code match means that the next character is not the same as the previous character so the process switches to the bit mode (461). In this case, the N+1 bit is the actual bit which was also appended (463) as previously described. If in the bit mode (459), then the code match indicated that the predicted bit was wrong so the actual bit, ABIT, is the inverted predicted bit, PBIT' (465). The next N bits of the code word are then removed (465).

Upon a return to FIG. 4A via the 4A1 off-page connector (435) if the process is on a character boundary (437), then the last character, LCHAR, is moved into the previous character position, PCHAR. The character made up of the accumulated bits forming the last character processed is loaded into the last character position, LCHAR, and is also stored in the memory (439) as part of the output data. The last character, LCHAR, is compared to the previous character, PCHAR (441). If they are the same, then the system switches to the character mode (443). Next the reset code space, RCS flag is sensed (445). If RCS flag is set, then the code space is reset and the RCS flag is reset (429). Next, or if the RCS flag is not set (445), the test is made for more input bits (431) as previously described.

The process just described with reference to FIGS. 4A and 4B show the recovery of data by a predictor which operates in the same fashion as the predictor device in the compression algorithm. The process recognizes two successive identical characters (bytes) and switches to the character mode and continues to store that character until a code word matches the eight bits and the ninth bit is a zero, causing the system to return to the bit mode.

The code words are generated by the same subroutine used in the compression algorithm and is described with respect to FIG. 5.

The code word generator subroutine flowchart is shown in FIG. 5 and will now be described in detail. The code words to be issued if an incorrect bit is predicted in the bit mode or a different character occurs in the character mode should be short if there is a high probability of prediction error and long if the probability of prediction error is small since it is not likely to be used. When the predictor supplies a probability of one-half and the code space has just been initialized, the code word length, N, will be one in the illustrated embodiment. Furthermore, the code word in the above illustration would be 0 so that, even though not used, subsequent code words cannot begin with 0, eliminating half the available possible code words.

The code word generated by the subroutine is usually constructed of two parts: a code word generated from logical operations on the value held in KREG and a stored part selected from several possible values derived from KREG. The stored part, which is logically ORed with the code word, is not always used depending on the value of the code word.

The first step (501) in the subroutine resets ZFLAG. The present value stored in KREG is saved as KOLD and KREG is modified by subtracting 2[- N]. ([ ]indicate that the enclosed values are exponents.) In the illustrative example, the KREG value is an eight bit binary number and N, the length of the code word, is limited to a value of eight. The value in the KREG is viewed as a fraction or reciprocal so that 2[-N] indicates that a binary one in the N-th position from the left is subtracted from the value in KREG. This can be accomplished in several ways, the simplest being to shift a binary vector, given by e(9), N bit positions to the right and subtracting the shifted result from KREG. (Note that e(9) represents a binary vector of zeros with a binary one in the 9th position, i.e., 100000000.) For N=5, the shifted result is 00001000 when the MSB (most significant bit) is dropped to leave an eight bit (byte) value. This is subtracted from the value in KREG, which, if initially all zeros, would result in a value of 11111000 in KREG.

If the resulting value in KREG is zero (503), then the ZFLAG is set (505). This indicates that the code space is exhausted, i.e., there are no more code words available for subsequent processing cycles. Next, the code word is generated (507) by logically ANDing the previous value of KREG, i.e., KOLD, with the inverse of the new value, i.e., CODEWORD=KOLD & KREG' (where ' indicates the logical operation NOT or inversion). The operation could also be written CODEWORD=KOLD AND NOT KREG.

The code word is tested (509) to determine whether it is all zeros or if the MSB is a binary one. If either condition is true, then no stored part is to be ORed with the generated code word and the program branches to initialize a POINTER to zero (521). Otherwise, the pointer is initialized (511) and the code word is shifted to the left one bit position (513). If the MSB is not a binary one when tested (515), then the pointer value is increased by a value of one (517) and the shifting (513) and testing (515) are repeated until the MSB is a binary one. Then, the stored part, which is accessed (518) using the address furnished by the pointer, is logically ORed with the shifted value of the code word (519). This completes the generation of the code word.

In the remaining steps, the stored parts are generated so that subsequent code words will be properly generated. A pointer is initialized to zero and a value K is produced by logically ANDing the KREG value with the inverse of the KOLD value, i.e., K=KREG AND NOT KOLD (521).

Next, the value of K is shifted left one bit position (523) and the MSB is tested for a binary value of one (525). If the MSB is one, then the code word previously generated is stored as a stored part using the pointer to supply the storage address (527). After storing or if the MSB is one, the pointer is incremented by one (529). If the pointer value is less than some limit, e.g., 7 (531), then K is shifted again (523) and the above sequence is repeated. When the pointer value is more than or equal to the limit, indicating that eight stored parts have been processed, the subroutine is exited and the program execution continues at the step following that which called the subroutine.

A further refinement of the model used for predicting the bits is to use separate pairs of ones and zeros counters for each character. In the preferred embodiment, a character is taken as eight consecutive bits, called a byte. Therefore, when a character (or byte) is to be processed for compression, the counters used for predicting the bits are the ones and zeros counters associated with that byte. Since there are 256 possible bytes of eight bits, there will be 512 counters, 256 zero counters and 256 ones counters.

Figure 6:
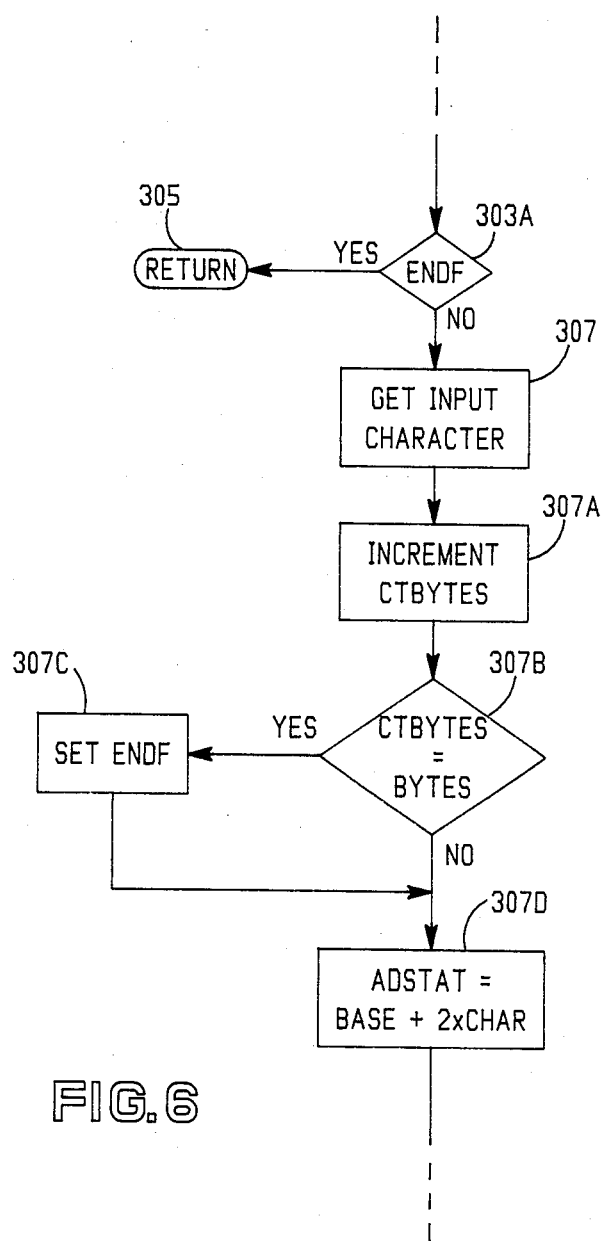
FIG. 6 is a flowchart segment showing the addition of steps for using multiple sets of bit counters for improving the compression ratio.

The flowchart of FIG. 6 illustrates the details of the implementation of additional counters. The flowchart of FIG. 6 expands the flowchart blocks 303 and 307 of FIG. 3A. The process is entered at a test for ENDF, the end flag (303A). If set, the routine is exited (305) because all the characters in the input message have been processed. If not set, then the next input character is fetched (307) and the count of bytes fetched, CTBYTES, is incremented (303D).

If the byte fetched is the last byte, i.e., if CTBYTES equals BYTES (the total number of characters in the input message) (307B), then ENDF is set (307C).

The use of separate counters for each possible input byte (character) improves the model and therefore increases the probability that the predicted bit is correct. The use of multiple counters eliminates the effects of having a long succession of bits of the same value. For example, if a string of twelve successive zeros were encountered when the values in the counters were small, then zeros would be predicted exclusively for a long period of random ones and zeros until the counters were more nearly equal.

While the invention has been particularly shown and described with reference to a preferred embodiment thereof, it will be understood by those skilled in the art that various changes and modifications in form and details may be made therein without departing from the spirit and scope of the invention according to the following claims.

Addressing a pair of counters for each separate byte is complicated, however, because the receiving node or decompression routine does not have a priori knowledge about the byte. The byte is known only after it has been decoded. Therefore, the decompression must employ a different scheme for selecting the counter pairs. Since the encoders 10 and 10' must operate exactly the same, however, the compression routine must use the same succession of counter pairs.

For the first bit, the 01 address (binary 00000001) is used. As each bit becomes known, the 01 address is left-shifted one bit position and the presently determined bit is shifted into the least significant bit position.

As an example, consider the byte B2 (binary 10110010) to be the byte being processed, most significant bit first. The succession of counters are:

| ADDR (HEX) | BINARY | NEW BIT | REMARKS |
|---|---|---|---|
| 01 | 00000001 | 1 | Addr. 01 is always used first |
| 03 | 00000011 | 0 | First bit shifted in |
| 06 | 00000110 | 1 | Next bit shifted in |
| 0D | 00001101 | 1 | Next bit shifted in |
| 1B | 00011011 | 0 | Next bit shifted in |
| 36 | 00110110 | 0 | Next bit shifted in |
| 6C | 01101100 | 1 | Next bit shifted in |
| D9 | 11011001 | 0 | Next bit shifted in |

-continued

| ADDR (HEX) | BINARY | NEW BIT | REMARKS |
|---|---|---|---|
| B2 | 10110010 | | Next bit shifted in |

The actual byte value is not known until the end of the byte cycle and is not used per se as an address. The above addresses are referred to below as constructed addresses.

While the invention has been particularly shown and described with reference to a preferred embodiment thereof, it will be understood by those skilled in the art that various changes and modifications in form and details may be made therein without departing from the spirit and scope of the invention according to the following claims.

What is claimed is:

1. The combination comprising:
    data input means for supplying ad seriatim bits of binary characters comprising information to be compressed;
    predicting means responsive to said data input means for supplying a predicted bit and a value representative of the probability that said predicted bit is equal to a corresponding bit from said data input means;
    encoding means responsive to said probability value for generating a binary code word having a number of bits proportional to said probability value;
    means responsive to said data input means and to said predicting means for comparing said predicted bit to a corresponding bit from said data input means;
    means coupled to said encoding means and responsive to said comparing means for applying said binary code word to a utilization device if said predicted bit is not equal to the corresponding bit from said data input means;
    means responsive to said data input means for comparing successive characters of said information to be compressed; and,
    means responsive to said character comparing means for causing said encoding means to generate successive unique code words of fixed length for each successive same character in said information to be compressed and for causing said applying means to apply the code word associated with the last same character when a different character is found by said character comparing means.

2. The method comprising the steps of:
    supplying ad seriatim data input bits of binary characters comprising information to be compressed;
    generating a predicted bit and a value representative of the probability that said predicted bit is equal to a corresponding bit from said data input bits, said predicted bit and the probability value based on the supplied serial bits;
    generating a binary code word having a number of bits proportional to said probability value;
    comparing a predicted bit to a corresponding bit from said data input bits;
    applying said binary code word to a utilization device if said predicted bit is not equal to the corresponding bit from said data input bits;
    comparing successive characters of said information to be compressed;
    generating successive unique code words of fixed length for each successive same character in said information to be compressed; and,
    applying the code word associated with the last same character when a different character is found by comparing said characters.

* * * * *